United States Patent
Gauthier et al.

(10) Patent No.: US 6,812,758 B2
(45) Date of Patent: Nov. 2, 2004

(54) NEGATIVE BIAS TEMPERATURE INSTABILITY CORRECTION TECHNIQUE FOR DELAY LOCKED LOOP AND PHASE LOCKED LOOP BIAS GENERATORS

(75) Inventors: Claude R. Gauthier, Cupertino, CA (US); Pradeep R. Trivedi, Sunnyvale, CA (US); Gin S. Yee, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/364,881

(22) Filed: Feb. 12, 2003

(65) Prior Publication Data

US 2004/0155696 A1 Aug. 12, 2004

(51) Int. Cl.$^7$ .............................................. H03L 7/06
(52) U.S. Cl. ........................ 327/158; 327/362; 324/765
(58) Field of Search .............................. 327/147, 148.1, 327/49, 156, 158, 539, 545, 546, 150, 276, 362; 323/313; 324/765; 365/202

(56) References Cited

U.S. PATENT DOCUMENTS

| | | | |
|---|---|---|---|
| 4,367,437 A | * | 1/1983 | Mikami ...................... 323/349 |
| 4,567,448 A | | 1/1986 | Ikeda .......................... 331/25 |
| 5,638,019 A | | 6/1997 | Frankeny .................... 327/295 |
| 6,064,947 A | | 5/2000 | Sun et al. ................... 702/106 |
| 6,380,798 B1 | * | 4/2002 | Mizuno et al. ............. 327/534 |
| 6,407,600 B1 | * | 6/2002 | Lu et al. ..................... 327/156 |
| 6,489,821 B1 | * | 12/2002 | Kurd et al. ................. 327/157 |
| 6,570,421 B1 | * | 5/2003 | Gauthier et al. ........... 327/156 |
| 6,621,356 B2 | * | 9/2003 | Gotz et al. ................... 331/25 |

OTHER PUBLICATIONS

Combined Search and Examination Report under Section 17 and 18(3) dated May 19, 2004, 5 pages.

\* cited by examiner

*Primary Examiner*—Terry D. Cunningham
(74) *Attorney, Agent, or Firm*—Osha & May L.L.P.

(57) ABSTRACT

A bias generator adjustment system adjusts a PLL or DLL bias generator dependent on negative bias temperature instability effects in an integrated circuit. The bias generator adjustment system uses an aging independent reference circuit and a bias circuit to operatively adjust a bias generator such that transistor 'aging' effects that occur over the lifetime of an integrated circuit are compensated for or corrected.

15 Claims, 7 Drawing Sheets

NEGATIVE BIAS TEMPERATURE INSTABILITY CORRECTION TECHNIQUE FOR DELAY LOCKED LOOP AND PHASE LOCKED LOOP BIAS GENERATORS

BACKGROUND OF INVENTION

As shown in FIG. 1, a typical computer system 10 has, among other components, a microprocessor 12, one or more forms of memory 14, integrated circuits 16 and 17 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modem microprocessors and other integrated circuits, however, are typically capable of operating at frequencies significantly higher than the system clock signal, and thus, it becomes important to ensure that operations involving the microprocessor 12 and the other components of the computer system 10 use a proper and accurate reference of time.

One component used within the computer system 10 to ensure a proper reference of time among the system clock signal and a microprocessor clock signal, i.e., "chip clock signal" or CHIP_CLK, is a type of clock generator known as a phase locked loop (PLL) 20. The PLL 20 is an electronic circuit that controls an oscillator such that the oscillator maintains a constant phase relative to the system clock signal. Referring to FIG. 1, the PLL 20 has as its input the system clock signal, which is its reference signal, and outputs a chip clock signal (shown in FIG. 1 as CHIP_CLK) to the microprocessor 12. The system clock signal and chip clock signal have a specific phase and frequency relationship controlled by the PLL 20. This relationship between the phases and frequencies of the system clock signal and chip clock signal ensures that the various components within the microprocessor 12 use a controlled and accounted for reference of time. When this relationship is not maintained by the PLL 20, however, the operations within the computer system 10 become indeterministic.

Another component used within the computer system 10 to ensure a proper reference of time among the system clock signal and a microprocessor clock signal, i.e., "clock out signal" or CLK_OUT, is a type of clock generator known as a delay locked loop (DLL) 22. As the frequencies of modern computers continue to increase, the need to rapidly transmit data between chip interfaces also increases. To accurately receive data, a clock signal is often sent to help recover the data. The clock signal determines when the data should be sampled or latched by a receiver circuit.

The clock signal may transition at the beginning of the time the data is valid. The receiver circuit, however, may require that the clock signal transition during the middle of the time the data is valid. Also, the transmission of the clock signal may degrade as it travels from its transmission point. In both circumstances, a delay locked loop 22, or "DLL," may be used to regenerate a copy of the clock signal at a fixed phase shift with respect to the original clock signal.

In FIG. 1, data is transmitted from integrated circuit 17 to the microprocessor 12. To aid in the recovery of the transmitted data, a clock signal 21 is also transmitted with the data. The microprocessor 12 may also transmit data to the integrated circuit 17 using an additional clock signal (not shown). The clock signal 21 may transition from one state to another at the beginning of data transmission. The microprocessor 12 requires a clock signal temporally located some time after the beginning of the valid data. Furthermore, the clock signal 21 may have degraded during transmission. The DLL 22 has the ability to regenerate the clock signal 21 to a valid state and to create a phase shifted version of the clock signal 21 to be used by other circuits. For example, the microprocessor 12 may use the phase shifted version of the clock signal 21 as the receiver circuit's sampling signal. The receiver circuit's sampling signal determines when the input to the receiver circuit should be sampled. The performance of a DLL 22 is critical and must maintain a proper reference of time on the CPU, or generically, an integrated circuit.

Circuit elements in a microprocessor 12, and more generally, an IC 16 and 17, continue to get smaller. Accordingly, more and more circuit elements may be packed into an IC 16 and 17. In FIG. 2, a cross sectional diagram of a particular type of circuit element, a p-channel transistor 200, is shown. The p-channel transistor 200 includes two n+ regions 204 and 206 implanted in a p-substrate 210 or a p-well. The two n+ regions 204 and 206 form a drain and source region for the p-channel transistor 200. The depth of the drain and source regions may determine a junction 209 thickness for current to flow from one n+ region 204 or 206, through a channel formed below a gate 202 when the transistor 200 is "on," to the other n+ region 206 or 204. A source contact 212 and drain contact 214 allow a connection with the n+ regions 204 and 206, respectively. The p-channel transistor 200 is separated from other devices by a field oxide 230 and 232.

The p-channel transistor 200 is controlled by a voltage potential on a gate 202. A gate contact 216 allows a connection with the gate 202. The gate 202 is separated from the p-substrate 210 by a gate oxide 208.

A voltage potential difference between the source contact 212 and drain contact 214 is denoted $V_{ds}$. A voltage potential difference between the gate contact 216 and the source contact 212 is denoted $V_{gs}$. The voltage potential to turn the p-channel transistor 200 "on," i.e., allow the p-channel transistor 200 to conduct current, is a threshold voltage potential denoted $V_t$.

FIG. 3 shows a diagram of a current-voltage characteristic for a typical metal-oxide transistor. As shown in FIG. 3, the p-channel transistor (200 shown in FIG. 2) is "off" when $|V_{gs}|<|V_t|$ 255. The p-channel transistor (200 shown in FIG. 2) is "on" and in a linear region of operation when $|V_{ds}|\leq|V_{gs}-V_t|$ and $|V_{gs}|\geq|V_t|$ 265. The p-channel transistor (200 shown in FIG. 2) is "on" and in a saturation region of operation when $|V_{ds}|>|V_{gs}-V_t|$ and $|V_{gs}|\geq|V_t|$ 275.

As circuit elements in an IC (16 and 17 shown in FIG. 1) continue to get smaller, features of the circuit elements, e.g., the gate oxide thickness, the depth of the two n+ regions (204 and 206 shown in FIG. 2), the spacing between the two n+ regions (204 and 206 shown in FIG. 2), etc., get smaller.

SUMMARY OF INVENTION

According to one aspect of the present invention, an integrated circuit comprises a bias generator arranged to output at least one bias voltage dependent on a control voltage and a circuit operatively connected to the bias generator and arranged to adjust the bias generator such that the bias generator is capable of operating substantially independent of an aging effect.

According to another aspect, a method comprises detecting a phase difference between a first signal and a second signal, generating a current dependent on the detecting, generating at least one bias voltage dependent on the current, and adjusting the at least one bias voltage dependent on a reference circuit that is responsive to an aging effect.

According to another aspect, an apparatus comprises: means for detecting a phase difference between a first signal and a second signal; means for generating a current dependent on the means for detecting; means for generating at least one bias voltage dependent on the current; means for generating an aging independent reference signal, where the means for generating the aging independent reference signal is responsive to an aging effect of the apparatus; and means for adjusting the at least one bias voltage dependent on the means for generating the aging independent reference signal.

Other aspects and advantages of the invention will be apparent from the following description and the appended claims.

DETAILED DESCRIPTION

Figure 1:
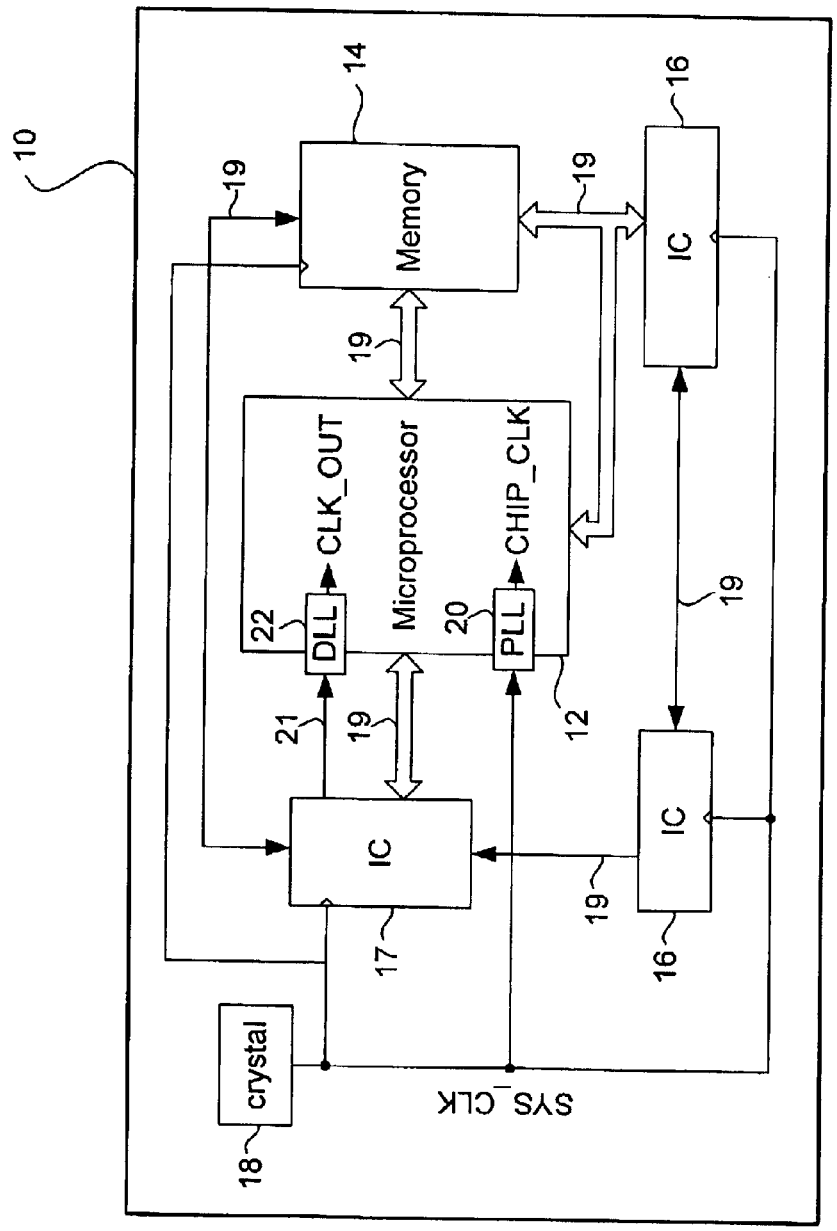
FIG. 1 shows a diagram of a typical computer system.

Embodiments of the present invention relate to a method and apparatus for a bias generator adjustment system in an integrated circuit. Adjustments are made to the bias generator dependent on an "aging effect" of transistors. Like elements in various figures are denoted by like reference numerals throughout the figures for consistency.

Figure 2:
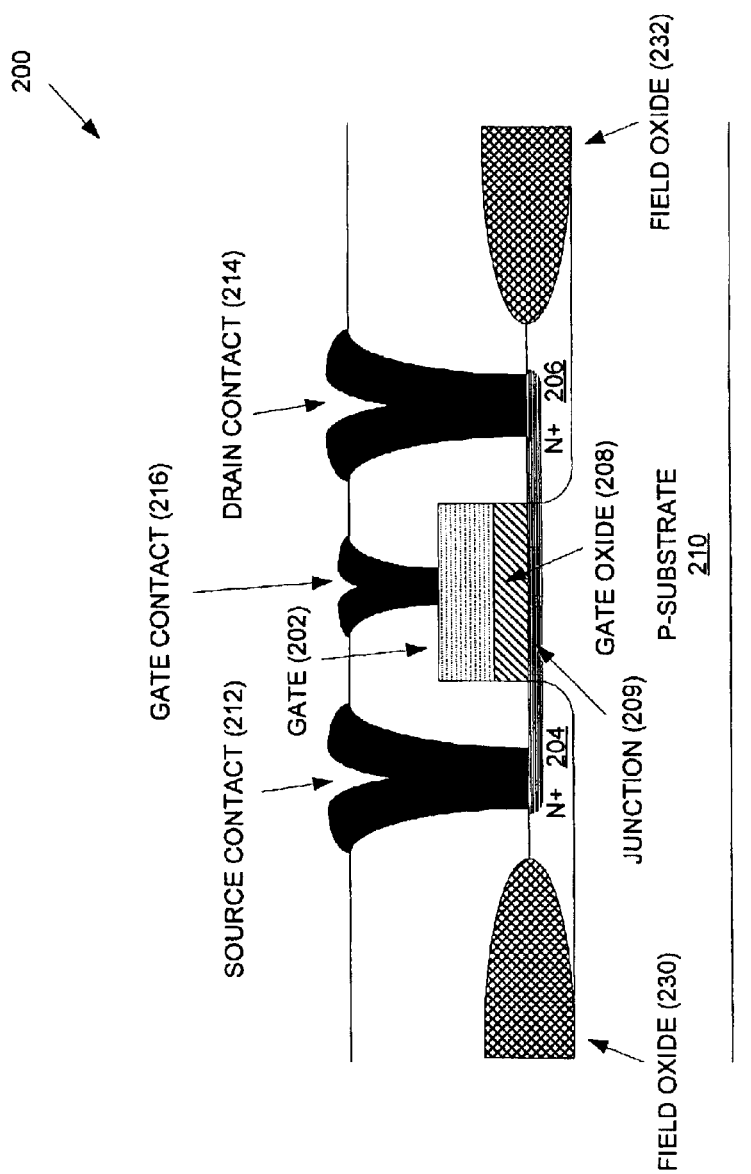
FIG. 2 shows a cross sectional diagram of a typical p-channel transistor.
Figure 3:
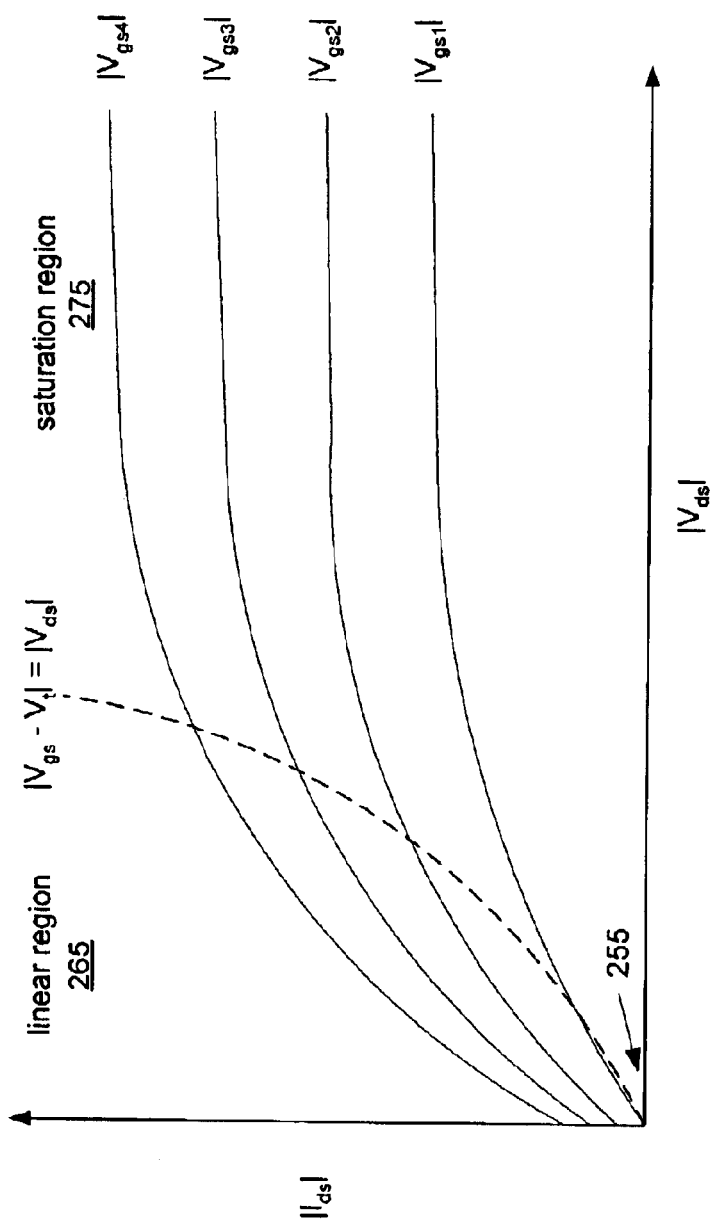
FIG. 3 shows a diagram of a current-voltage characteristic for a typical metal-oxide transistor.

As circuit elements (i.e., n-channel and/or p-channel transistors) in an IC (e.g., 16 and 17 shown in FIG. 1) continue to get smaller, one effect is that the gate oxide thickness (208 shown in FIG. 2) becomes thinner. The thin gate oxide thickness may cause a threshold voltage potential to vary, or "age," over time. As a transistor ages with time, the threshold voltage potential of the transistor may increase. Accordingly, aging of a transistor may affect critical circuits, thereby adversely impacting IC performance.

Also, as circuit elements (i.e., transistors) get smaller, a channel formed for conduction of current between the n+ regions (204 and 206 shown in FIG. 2) may have a junction 209 thickness that is thinner relative to prior generation transistors. Furthermore, a depth of the two n+ regions (204 and 206 shown in FIG. 2) implanted in a p-substrate (210 shown in FIG. 2) or a p-well may cause a junction 209 thickness that is thinner relative to prior generation transistors. Similarly, n-channel transistors may have a thin junction thickness. A thin junction 209 thickness formed by the channel and shallower implant regions (to form a source and drain region of a transistor) may cause a transistor to "age" over time. Aging may affect one or more operational characteristics of a transistor as time elapses from when the transistor was manufactured. Accordingly, aging of a transistor may affect critical circuits, thereby adversely impacting IC performance.

Figure 4:
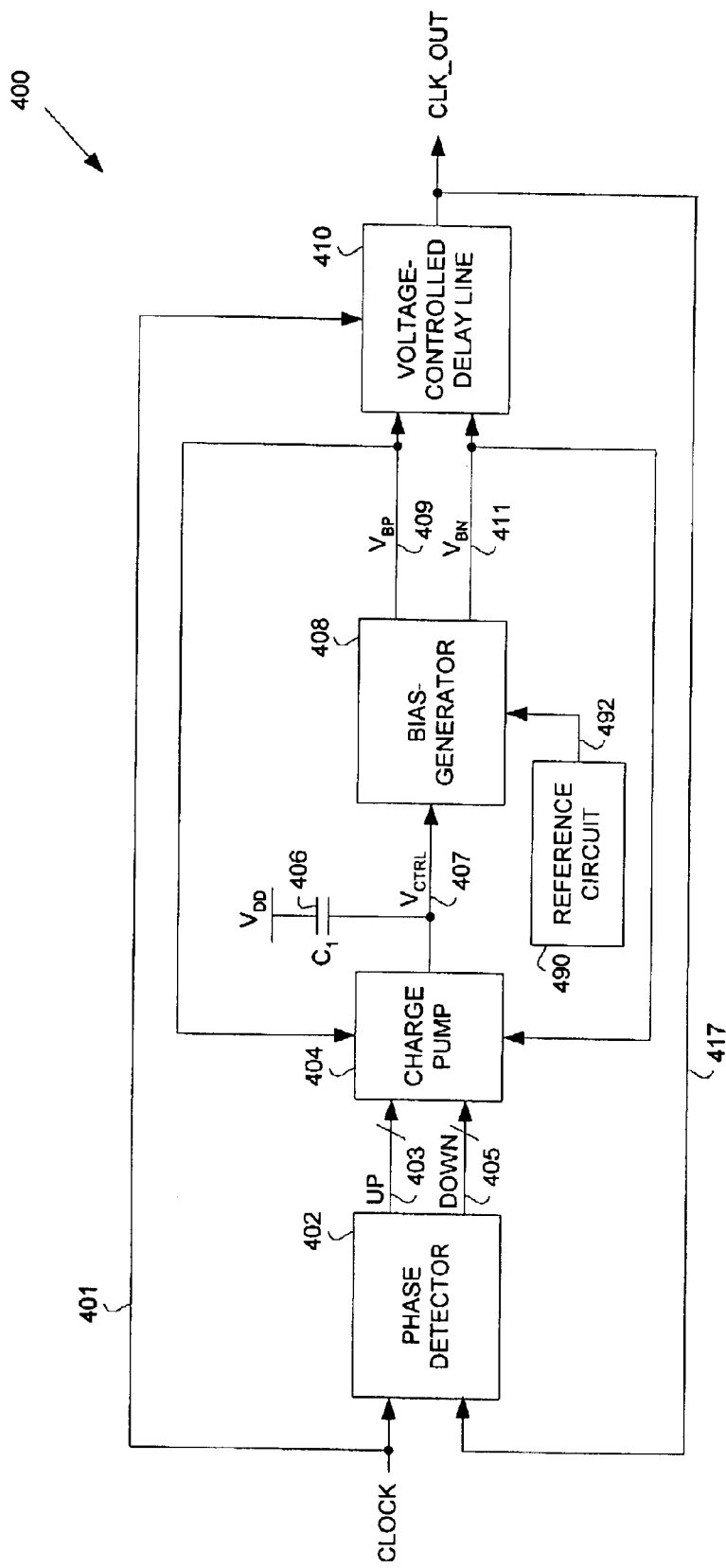
FIG. 4 shows a delay locked loop system in accordance with an embodiment of the present invention.

FIG. 4 shows a block diagram of an exemplary delay locked loop (DLL) system 400 in accordance with an embodiment of the present invention. Clock signal 401 is input to the DLL system 400 to create a phased (i.e., delayed) output. Particularly, clock signal 401 is input to a voltage-controlled delay line 410 and to a phase detector 402 of the DLL system 400. The phase detector 402 measures whether a phase difference between the clock signal 401 and an output signal, clk_out 417, of the voltage-controlled delay line 410 has the desired amount of delay. Depending on the phase difference, the phase detector 402 produces signals that control a charge pump 404. The phase detector 402 uses an up signal 403 and a down signal 405 to adjust the charge pump 404 to increase or decrease its output current.

To ensure that the charge pump 404 maintains some nominal current output, the charge pump 404 is internally biased. The internal biasing of the charge pump 404 is dependent on bias signals, $V_{BP}$ 409 and $V_{BN}$ 411, generated from a bias generator 408 (discussed below). The up and down signals 403 and 405 adjust the current output of the charge pump 404 with respect to the nominal current set by the bias signals 409 and 411.

The charge pump 404 adds or removes charge from a capacitor $C_1$ 406, which, in turn, changes a voltage potential at the input of the bias-generator 408. The capacitor 406 is connected between a power supply, $V_{DD}$, and a control signal, $V_{CTRL}$ 407. The bias-generator 408 produces the bias signals 409 and 411 in response to the control signal 407, which, in turn, controls the delay of the voltage-controlled delay line 410 and, as mentioned above, maintains a nominal current output from the charge pump 404.

In FIG. 4, the voltage-controlled delay line 410 may be implemented using current starved elements. In other words, the delays of the voltage-controlled delay line 410 may be controlled by modifying the amount of current available for charging and discharging capacitances within the voltage-controlled delay line 410. The linearity of a voltage controlled delay line's characteristics determines the stable range of frequencies over which the DLL system 400 can operate. The output signal 417 of the voltage-controlled delay line 410 represents a phase delayed copy of clock signal 401 that is then used by other circuits.

Still referring to FIG. 4, the negative feedback created by the output signal 417 in the DLL system 400 adjusts the delay through the voltage-controlled delay line 410. The phase detector 402 integrates the phase error that results between the clock signal 401 and the output signal 417. The voltage-controlled delay line 410 delays the output signal 417 by a fixed amount of time such that a desired delay between the clock signal 401 and the output signal 417 is maintained.

Proper operation of the microprocessor (12 shown in FIG. 1) depends on the DLL system 400 maintaining a constant phase delay between the clock signal 401 and the output signal 417. The DLL system 400 may not operate as desired if circuit elements vary, or "age," over time. In one embodiment of the present invention, a reference circuit 490 is operatively connected using a reference signal line 492 to the bias generator 408. One of ordinary skill in the art will understand that the reference signal line 492 may carry a digital or analog signal.

In FIG. 4, the reference circuit 490 generates a signal to the bias generator 408 that is representative of variations caused by aging. In one embodiment of the present invention, the bias generator 408 is operatively adjusted such that variations due to aging of circuit elements within the bias generator 408 are reduced. One of ordinary skill in the art understands that most circuits age; however, circuit elements within the bias generator 408 may age such that the bias generator 408 varies dramatically from the bias generator's 404 initial design parameters. The reference circuit 490 generates a signal, representative of variations caused by aging, that helps reduce variations in the bias generator 404 caused by aging effects.

Figure 5:
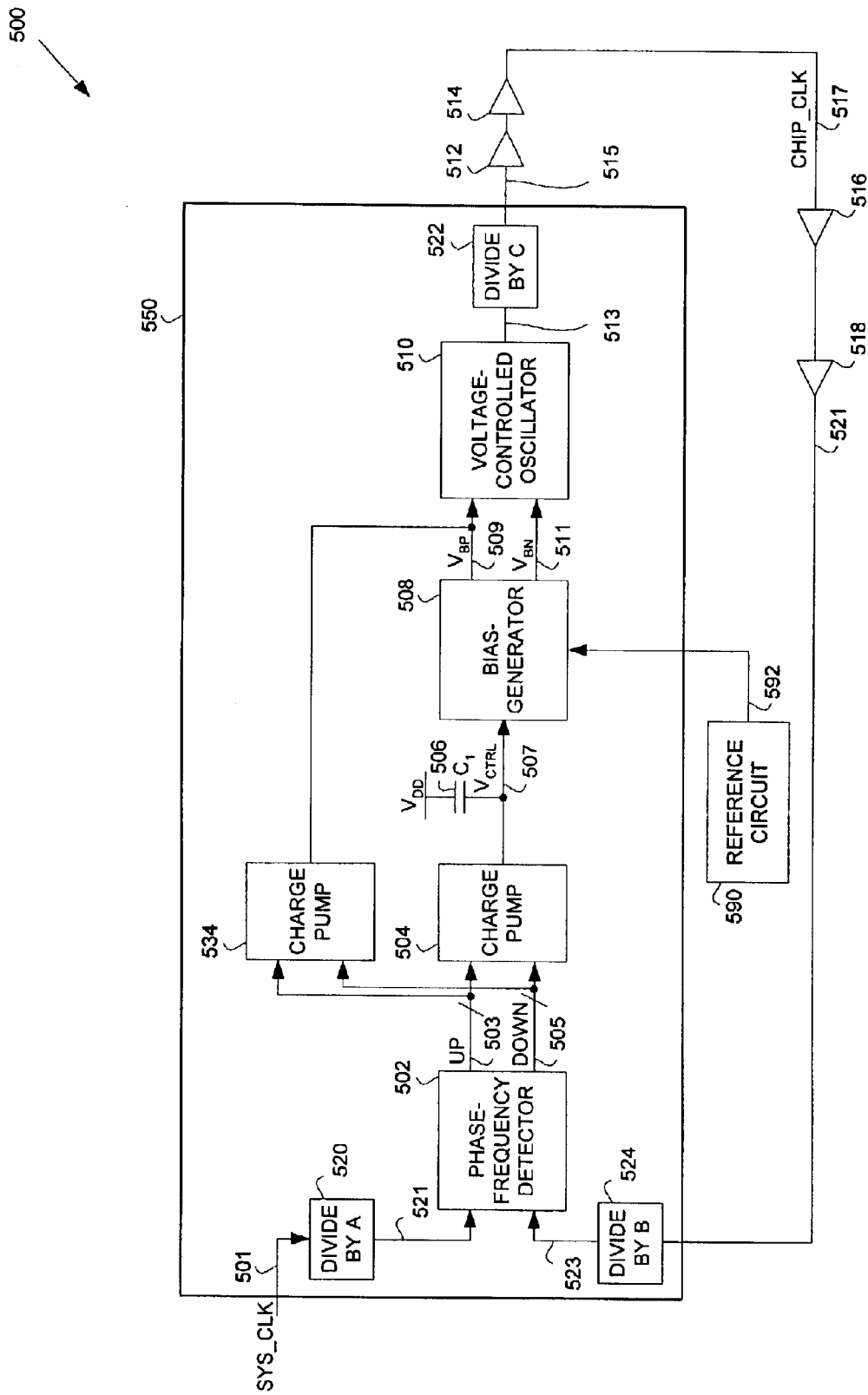
FIG. 5 shows a phase locked loop system in accordance with an embodiment of the present invention.

FIG. 5 shows a block diagram of an exemplary phase locked loop (PLL) system 500 in accordance with an embodiment of the present invention. The PLL system 500 includes a PLL core 550, buffers 512, 514, 516, and 518 and a feedback loop signal 521 on a feedback loop path, The buffers 512 and 514 increase the drive strength of an output clock signal 515 to supply other circuits of the microprocessor (12 in FIG. 1) with a chip clock signal 517. The buffers 516 and 518 buffer the chip clock signal 517 to additional circuits of the microprocessor (12 in FIG. 1). The time delay created by the buffers 512, 514, 516, and 518 is accounted for in the feedback signal 521 that is supplied to the PLL core 550.

The PLL core 550 is designed to output the chip clock signal 517, which is a multiple of the system clock signal 501. When the PLL system 500 is in "lock," the chip clock signal 517 and system clock signal 501 maintain a specific phase and frequency relationship. To allow different multiplication ratios, the PLL core 550 may use several "divide by" circuits. A "divide by" circuit reduces the frequency of the input to the "divide by" circuit at its output by a specified factor. For example, the PLL core 550 uses a divide by A circuit 520 with the system clock signal 501, a divide by C circuit 522 with a voltage-controlled oscillator 510 output signal 513, and a divide by B circuit 524 with the feedback loop signal 521.

A phase-frequency detector 502 aligns the transition edge and frequency of a clock A signal 521 and a clock B signal 523. The phase-frequency detector 502 adjusts its output frequency in order to zero any phase and frequency difference between the clock A signal 521 and the clock B signal 523. The phase-frequency detector 502 produces signals that control charge pumps 504 and 534. The phase-frequency detector 502 controls the charge pumps 504 and 534 to increase or decrease their output using control signals up 503 and down 505. The charge pump 504 adds or removes charge from a capacitor $C_1$ 506 that changes the voltage potential at the input of a bias-generator 508. The capacitor 506 is connected between a power supply $V_{DD}$ and a voltage potential on a control signal $V_{CTRL}$ 507. The charge pump 534 adds or removes charge from a bias voltage $V_{BP}$ 509 of a bias-generator 508.

The bias-generator 508 produces bias voltages $V_{BP}$ 509 and $V_{BN}$ 511 in response to the voltage potential on the control signal 507. The PLL core 550 may be self-biased by adding the charge pump 534 to the bias-generator 508 bias voltage $V_{BP}$ 509. The addition of a second charge pump 534 allows the removal of a resistor in series with the capacitor 506. A voltage-controlled oscillator 510 produces an output signal 513 that has a frequency related to the bias voltages $V_{BP}$ 509 and $V_{BN}$ 511.

The "divide by" circuits 520, 522, and 524 determine the frequency multiplication factor provided by the PLL core 550. The addition of "divide by" circuits 520, 522, and 524 enables the PLL core 550 to multiply the system clock signal 501. Multiplying the system clock signal 501 is useful when the chip clock signal 517 must have a higher frequency than the system clock signal 501.

For example, the variables A and C may both be set to one in the divide by A circuit 520 and divide by C circuit 522, respectively. The variable B may be set to 10 in the divide by B circuit 524. The phase-frequency detector 502 aligns the transition edge and frequency of the clock A signal 521 and the clock B signal 523. The phase-frequency detector 502 adjusts the PLL core 550 output clock signal 515 frequency in order to zero any phase and frequency difference between the clock A signal 521 and the clock B signal 523. Because the clock B signal 523 has a divide by B circuit 524 that reduces its input frequency by 10, the phase-frequency detector 502 adjusts the voltage-controlled oscillator 510 output signal 513 to a frequency 10 times greater than the clock A signal 521. Accordingly, the chip clock signal 517 is 10 times higher in frequency than the system clock signal 501.

Proper operation of the microprocessor (12 shown in FIG. 1) depends on the PLL system 500 maintaining a constant phase delay between the system clock signal 501 and the chip clock signal 517. The PLL system 500 may not operate as desired if circuit elements vary, or "age," over time. In one embodiment of the present invention, a reference circuit 590 is operatively connected using a reference signal line 592 to the bias generator 508. One of ordinary skill in the art will understand that the reference signal line 592 may carry a digital or analog signal.

In FIG. 5, the reference circuit 590 generates a signal to the bias generator 508 that is representative of variations caused by aging. In an embodiment of the present invention, the bias generator 508 are operatively adjusted such that variations due to aging of circuit elements within the bias generator 508 are reduced.

Figure 6:
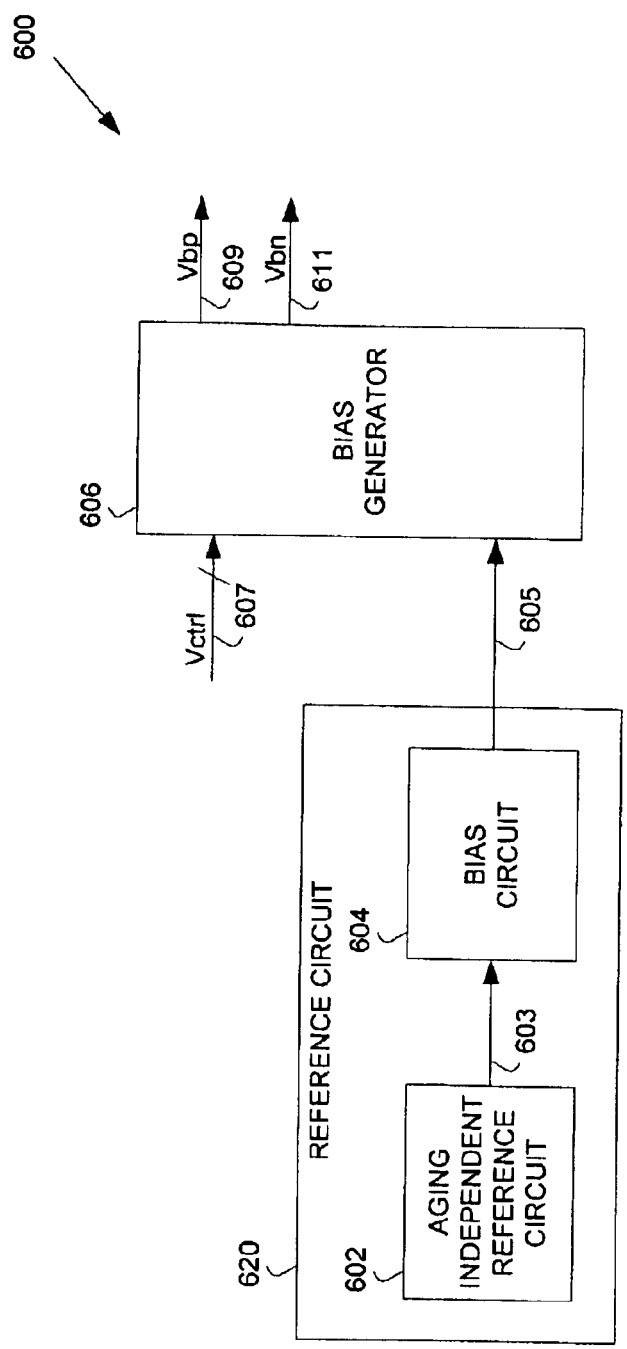
FIG. 6 shows a bias generator adjustment system in accordance with an embodiment of the present invention.

FIG. 6 shows a block diagram of an exemplary bias generator adjustment system 600 in accordance with an embodiment of the present invention. The bias generator adjustment system 600 includes a bias generator 606 and a reference circuit 620. The bias generator 606 generates bias voltages $V_{BP}$ 609 and $V_{BN}$ 611 dependent on a control voltage $V_{CTRL}$ 607. One or both of the bias voltages $V_{BP}$ 609 and $V_{BN}$ 611 from the bias generator 606 may vary over time, caused by aging of circuit elements in the bias generator 606. A reference circuit 620 is operatively connected using a reference signal line 605 to the bias generator 606. One of ordinary skill in the art will understand that the reference signal line 605 may carry a digital or analog signal. In one embodiment of the present invention, the reference signal line 605 carries an analog signal representative of variations caused by aging.

The reference circuit 620 includes an aging independent reference circuit 602 and a bias circuit 604. In an embodiment of the present invention, the aging independent reference circuit 602 may generate a voltage potential or a current for an aging independent reference signal on signal line 603. Accordingly, signal line 603 may carry the aging independent reference signal that is substantially independent with respect to aging effects. In one embodiment of the present invention, the aging independent reference circuit 602 may be a bandgap voltage potential reference.

The bias circuit 604 may use the aging independent reference signal on signal line 603 to determine a variation in transistor performance caused by aging effects. A signal on the reference signal line 605 may represent a result of a comparison between the aging independent reference signal on signal line 603 and at least one transistor whose performance may have varied due to aging effects. For example, a threshold voltage potential may vary, or "age," over time. The signal on the reference signal line 605 may adjust the bias generator 606 such that the current on the out signal 611 responds to the up signal 607 or the down signal 609 regardless of aging that may occur within circuit elements in the bias generator 606.

Figure 7:
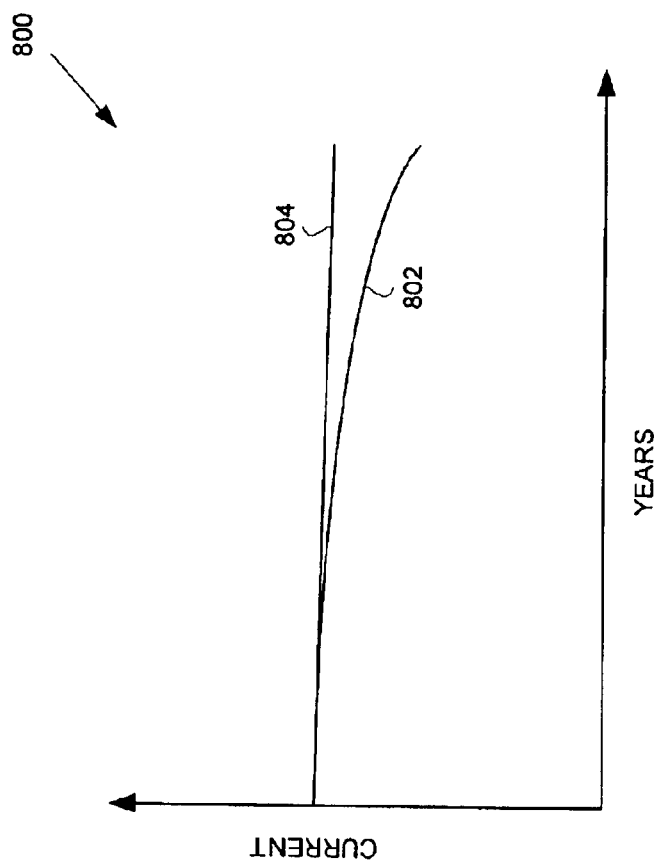
FIG. 7 shows a graph of current through a transistor with and without a bias generator adjustment system in accordance with an embodiment of the present invention.

FIG. 7 shows an exemplary graph 800 of current through a transistor with and without a bias generator adjustment system in accordance with an embodiment of the present invention. Graph line 802 shows current through a transistor without a charge pump adjustment system. The current decreases over time due to aging effects. Graph line 804 shows current through a transistor with a bias generator adjustment system. The current remains substantially constant over time because effects due to aging have been compensated by a bias generator adjustment system. For example, an aging independent reference circuit (602 shown in FIG. 6) and/or a bias circuit (604 shown in FIG. 6) may adjust (or bias) a transistor such that aging effects do not affect performance of the transistor. In the case of a PLL, for example, degradation of a transistor's performance, as shown by graph line 802, may modify a PLL's loop bandwidth such that the PLL becomes unstable.

Advantages of the present invention may include one or more of the following. In one or more embodiments, because transistors may age, a reference circuit that responds to aging effects may adjust a bias generator. Accordingly, the bias generator biased by the reference circuit may not skew over a lifetime, or other time period, of an IC.

In one or more embodiments, a reference circuit uses an aging independent reference circuit and a bias circuit. The bias circuit compares an output from the aging independent reference circuit and at least one circuit element that is affected by aging effects. Accordingly, the reference circuit may adjust a PLL or DLL bias generator such that an output from the bias generator does not substantially skew over a lifetime, or other time period, of an IC.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a bias generator arranged to output at least one bias voltage dependent on a control voltage; and
   a reference circuit operatively connected to the bias generator, the reference circuit comprising an aging independent element and an aging dependent element, wherein the reference circuit is arranged to generate a signal to the bias generator based on a comparison of a signal dependent on the aging independent element and a signal dependent on the aging dependent element.

2. The integrated circuit of claim 1, wherein the reference circuit comprises an aging independent reference circuit and a bias circuit, the aging independent reference circuit comprising the aging independent element and the bias circuit comprising the aging dependent element.

3. The integrated circuit of claim 2, wherein the aging independent reference circuit comprises a bandgap voltage potential reference.

4. The integrated circuit of claim 2, wherein the aging independent reference circuit generates a voltage potential that is independent of an aging effect.

5. The integrated circuit of claim 2, wherein the aging independent reference circuit generates a current that is independent of an aging effect.

6. The integrated circuit of claim 1, further comprising a delay locked loop, wherein the delay locked loop comprises the bias generator.

7. The integrated circuit of claim 1, further comprising a phase locked loop, wherein the phase locked loop comprises the bias generator.

8. The integrated circuit of claim 1, further comprising a charge pump arranged to output the control voltage.

9. A method, comprising:
   detecting a phase difference between a first signal and a second signal;
   generating a current dependent on the detecting;
   generating at least one bias voltage dependent on the current;
   generating an aging independent reference signal;
   generating an aging dependent reference signal; and
   adjusting the at least one bias voltage dependent on a comparison of the aging independent reference signal and the aging dependent reference signal.

10. The method of claim 9, wherein the generating the aging independent reference signal produces an aging independent voltage potential.

11. The method of claim 9, wherein the generating the aging independent reference signal produces an aging independent current.

12. The method of claim 9, wherein the generating the aging independent reference signal uses a bandgap voltage potential reference.

13. The method of claim 9, further comprising:
   producing a signal delay with an amount of delay operatively dependent on the detecting.

14. The method of claim 9, further comprising generating an oscillating signal with a frequency operatively dependent on the detecting.

15. An apparatus, comprising:
   means for detecting a phase difference between a first signal and a second signal;
   means for generating a current dependent on the means for detecting;
   means for generating at least one bias voltage dependent on the current;
   means for generating an aging independent reference signal, that is independent of an aging effect of the apparatus; and
   means for generating a reference signal dependent on a comparison of the aging independent reference signal and an aging dependent reference signal, wherein the reference signal adjusts the means for generating the at least one bias voltage.

* * * * *